United States Patent
Zhang et al.

(10) Patent No.: US 9,219,469 B2
(45) Date of Patent: Dec. 22, 2015

(54) SYSTEMS AND METHODS FOR FILTER CONSTRAINT ESTIMATION

(75) Inventors: Haotian Zhang, Longmont, CO (US); Hongwei Song, Longmont, CO (US); Jingfeng Liu, Longmont, CO (US); Yu Liao, Longmont, CO (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 1407 days.

(21) Appl. No.: 12/887,330

(22) Filed: Sep. 21, 2010

(65) Prior Publication Data

US 2012/0069891 A1    Mar. 22, 2012

(51) Int. Cl.
*H03H 7/30* (2006.01)
*H04N 11/02* (2006.01)
*H03H 17/02* (2006.01)

(52) U.S. Cl.
CPC ....... *H03H 17/0289* (2013.01); *H03H 17/0294* (2013.01)

(58) Field of Classification Search
USPC .................. 375/229–236, 219, 220, 375/240.26–240.29, 284, 285, 316, 340, 375/346, 350
See application file for complete search history.

(56) References Cited

U.S. PATENT DOCUMENTS

| | | | |
|---|---|---|---|
| 5,278,846 A | 1/1994 | Okayama et al. | |
| 5,325,402 A | 6/1994 | Ushirokawa | |
| 5,392,299 A | 2/1995 | Rhines et al. | |
| 5,471,500 A | 11/1995 | Blaker et al. | |
| 5,513,192 A | 4/1996 | Janku et al. | |
| 5,550,870 A | 8/1996 | Blaker et al. | |
| 5,612,964 A | 3/1997 | Haraszti | |
| 5,701,314 A | 12/1997 | Armstrong et al. | |
| 5,710,784 A | 1/1998 | Kindred et al. | |
| 5,712,861 A | 1/1998 | Inoue et al. | |
| 5,717,706 A | 2/1998 | Ikeda | |
| 5,802,118 A | 9/1998 | Bliss et al. | |
| 5,844,945 A | 12/1998 | Nam et al. | |
| 5,898,710 A | 4/1999 | Amrany | |
| 5,923,713 A | 7/1999 | Hatakeyama | |
| 5,978,414 A | 11/1999 | Nara | |
| 5,983,383 A | 11/1999 | Wolf | |

(Continued)

FOREIGN PATENT DOCUMENTS

WO    WO 2006/016751    2/2006

OTHER PUBLICATIONS

U.S. Appl. No. 11/461,026, filed Jul. 31, 2006, Tan, Weijun.

(Continued)

*Primary Examiner* — Linda Wong

(57) ABSTRACT

Various embodiments of the present invention provide systems and methods for calibrating a data processing circuit. For example, a method for calibrating a data processing circuit is discussed that includes providing a digital filter, providing a detector circuit, and providing an analog filter. Operation of the digital filter is at least in part governed by filter taps that correspond to a filter tap constraint value. Operation of the detector circuit is at least in part governed by a target parameter. Operation of the analog filter is at least in part governed by an analog parameter that is one of a plurality of analog parameters. The methods further include selecting a target parameter, and calculating the filter tap constraint value based on the target parameter. Combinations of the target parameter, the calculated filter tap constraint value, and each of the plurality of analog parameters are applied to identify the analog parameter.

19 Claims, 9 Drawing Sheets

(56) References Cited

U.S. PATENT DOCUMENTS

| | | | |
|---|---|---|---|
| 6,005,897 A | 12/1999 | McCallister et al. | |
| 6,023,783 A | 2/2000 | Divsalar et al. | |
| 6,029,264 A | 2/2000 | Kobayashi et al. | |
| 6,041,432 A | 3/2000 | Ikeda | |
| 6,065,149 A | 5/2000 | Yamanaka | |
| 6,097,764 A | 8/2000 | McCallister et al. | |
| 6,145,110 A | 11/2000 | Khayrallah | |
| 6,216,249 B1 | 4/2001 | Bliss et al. | |
| 6,216,251 B1 | 4/2001 | McGinn | |
| 6,229,467 B1 | 5/2001 | Eklund et al. | |
| 6,266,795 B1 | 7/2001 | Wei | |
| 6,317,472 B1 | 11/2001 | Choi et al. | |
| 6,351,832 B1 | 2/2002 | Wei | |
| 6,377,610 B1 | 4/2002 | Hagenauer et al. | |
| 6,381,726 B1 | 4/2002 | Weng | |
| 6,438,717 B1 | 8/2002 | Butler et al. | |
| 6,473,878 B1 | 10/2002 | Wei | |
| 6,476,989 B1 | 11/2002 | Chainer et al. | |
| 6,625,775 B1 | 9/2003 | Kim | |
| 6,657,803 B1 | 12/2003 | Ling et al. | |
| 6,671,404 B1 | 12/2003 | Katawani et al. | |
| 6,748,034 B2 | 6/2004 | Hattori et al. | |
| 6,757,862 B1 | 6/2004 | Marianetti | |
| 6,785,863 B2 | 8/2004 | Blankenship et al. | |
| 6,788,654 B1 | 9/2004 | Hashimoto et al. | |
| 6,804,695 B1* | 10/2004 | Hsu | 708/322 |
| 6,810,502 B2 | 10/2004 | Eidson | |
| 6,980,382 B2 | 12/2005 | Hirano et al. | |
| 6,986,098 B2 | 1/2006 | Poeppelman | |
| 7,010,051 B2 | 3/2006 | Murayama et al. | |
| 7,047,474 B2 | 5/2006 | Rhee et al. | |
| 7,058,873 B2 | 6/2006 | Song et al. | |
| 7,073,118 B2 | 7/2006 | Greenberg et al. | |
| 7,093,179 B2 | 8/2006 | Shea | |
| 7,113,356 B1 | 9/2006 | Wu | |
| 7,173,783 B1 | 2/2007 | McEwen et al. | |
| 7,184,486 B1 | 2/2007 | Wu et al. | |
| 7,191,378 B2 | 3/2007 | Eroz et al. | |
| 7,203,015 B2 | 4/2007 | Sakai et al. | |
| 7,203,887 B2 | 4/2007 | Eroz et al. | |
| 7,236,757 B2 | 6/2007 | Raghavan et al. | |
| 7,257,764 B2 | 8/2007 | Suzuki et al. | |
| 7,310,768 B2 | 12/2007 | Eidson et al. | |
| 7,313,750 B1 | 12/2007 | Feng et al. | |
| 7,370,258 B2 | 5/2008 | Iancu et al. | |
| 7,403,752 B2 | 7/2008 | Raghavan et al. | |
| 7,430,256 B2 | 9/2008 | Zhidkov | |
| 7,502,189 B2 | 3/2009 | Sawaguchi et al. | |
| 7,505,537 B1 | 3/2009 | Sutardja | |
| 7,523,375 B2 | 4/2009 | Spencer | |
| 7,587,657 B2 | 9/2009 | Haratsch | |
| 7,590,168 B2 | 9/2009 | Raghavan et al. | |
| 7,702,989 B2 | 4/2010 | Graef et al. | |
| 7,712,008 B2 | 5/2010 | Song et al. | |
| 7,801,200 B2 | 9/2010 | Tan | |
| 7,802,163 B2 | 9/2010 | Tan | |
| 2002/0094044 A1* | 7/2002 | Kolze et al. | 375/346 |
| 2003/0063405 A1 | 4/2003 | Jin et al. | |
| 2003/0081693 A1 | 5/2003 | Raghavan et al. | |
| 2003/0087634 A1 | 5/2003 | Raghavan et al. | |
| 2003/0099289 A1* | 5/2003 | Birru | 375/233 |
| 2003/0112896 A1 | 6/2003 | Raghavan et al. | |
| 2003/0134607 A1 | 7/2003 | Raghavan et al. | |
| 2004/0071206 A1 | 4/2004 | Takatsu | |
| 2004/0098659 A1 | 5/2004 | Bjerke et al. | |
| 2004/0228399 A1* | 11/2004 | Fimoff | H04L 25/03057 375/233 |
| 2005/0010855 A1 | 1/2005 | Lusky | |
| 2005/0111540 A1 | 5/2005 | Modrie et al. | |
| 2005/0141378 A1* | 6/2005 | Tatsuzawa | G11B 20/10046 369/53.2 |
| 2005/0157780 A1 | 7/2005 | Werner et al. | |
| 2005/0195749 A1 | 9/2005 | Elmasry et al. | |
| 2005/0216819 A1 | 9/2005 | Chugg et al. | |
| 2005/0273688 A1 | 12/2005 | Argon | |
| 2006/0020872 A1 | 1/2006 | Richardson et al. | |
| 2006/0031737 A1 | 2/2006 | Chugg et al. | |
| 2006/0123285 A1 | 6/2006 | De Araujo et al. | |
| 2006/0140311 A1 | 6/2006 | Ashley et al. | |
| 2006/0168493 A1 | 7/2006 | Song et al. | |
| 2006/0195772 A1 | 8/2006 | Graef et al. | |
| 2006/0248435 A1 | 11/2006 | Haratsch | |
| 2006/0256670 A1 | 11/2006 | Park et al. | |
| 2007/0011569 A1 | 1/2007 | Vila Casado et al. | |
| 2007/0047635 A1 | 3/2007 | Stojanovic et al. | |
| 2007/0110200 A1 | 5/2007 | Mergen et al. | |
| 2007/0230407 A1 | 10/2007 | Petrie et al. | |
| 2007/0286270 A1 | 12/2007 | Huang et al. | |
| 2008/0049825 A1 | 2/2008 | Chen et al. | |
| 2008/0055122 A1 | 3/2008 | Tan | |
| 2008/0065970 A1 | 3/2008 | Tan | |
| 2008/0069373 A1 | 3/2008 | Jiang et al. | |
| 2008/0168330 A1 | 7/2008 | Graef et al. | |
| 2008/0205504 A1* | 8/2008 | Tsuie | H04L 25/03019 375/233 |
| 2009/0199071 A1 | 8/2009 | Graef | |
| 2009/0235116 A1 | 9/2009 | Tan et al. | |
| 2009/0235146 A1 | 9/2009 | Tan | |
| 2009/0259915 A1 | 10/2009 | Livshitz et al. | |
| 2009/0273492 A1 | 11/2009 | Yang et al. | |
| 2009/0274247 A1 | 11/2009 | Galbraith et al. | |
| 2010/0002795 A1 | 1/2010 | Raghavan et al. | |
| 2010/0061492 A1 | 3/2010 | Noelder | |
| 2010/0070837 A1 | 3/2010 | Xu et al. | |
| 2010/0164764 A1 | 7/2010 | Nayak | |
| 2010/0185914 A1 | 7/2010 | Tan et al. | |

OTHER PUBLICATIONS

U.S. Appl. No. 11/461,198, filed Jul. 31, 2006, Tan, Weijun.
U.S. Appl. No. 11/461,283, filed Jul. 31, 2006, Tan, Weijun.
U.S. Appl. No. 12/540,283, filed Aug. 12, 2009, Liu, et al.
U.S. Appl. No. 12/652,201, filed Jan. 5, 2010, Mathew, et al.
U.S. Appl. No. 12/763,050, filed Apr. 19, 2010, Ivkovic, et al.
U.S. Appl. No. 12/792,555, filed Jun. 2, 2101, Liu, et al.
U.S. Appl. No. 12/887,330, filed Sep. 21, 2010, Zhang, et al.
U.S. Appl. No. 12/887,369, filed Sep. 21, 2010, Liu et al.
U.S. Appl. No. 12/901,816, filed Oct. 11, 2010, Li et al.
U.S. Appl. No. 12/917,756, filed Nov. 2, 2010, Miladinovic et al.
U.S. Appl. No. 12/947,931, filed Nov. 17, 2010, Yang, Shaohua.
U.S. Appl. No. 12/947,947, filed Nov. 17, 2010, Ivkovic et al.
U.S. Appl. No. 12/972,942, filed Dec. 20, 2010, Liao et al.
Casado et al., Multiple-rate low-denstiy parity-check codes with constant blocklength, IEEE Transations on communications, Jan. 2009, vol. 57, pp. 75-83.
Eleftheriou, E. et al., "Low Density Parity-Check Codes for Digital Subscriber Lines", Proc ICC 2002, pp. 1752-1757.
Han and Ryan, "Pinning Techniques for Low-Floor Detection/Decoding of LDPC-Coded Partial Response Channels", 5th International Symposium on Turbo Codes &Related Topics, 2008.
Vasic, B., "High-Rate Low-Density Parity-Check Codes Based on Anti-Pasch Affine Geometries," Proc ICC 2002, pp. 1332-1336.
Yeo et al., "VLSI Architecture for Iterative Decoders in Magnetic Storage Channels", Mar. 2001, pp. 748-755, IEEE trans. Magnetics, vol. 37, No. 2.
Zhong, "VLSI Architecture of LDPC Based Signal Detection and Coding System for Magnetic Recording Channel", Thesis, RPI, Troy, NY, pp. 1-95, May 2006.

\* cited by examiner

SYSTEMS AND METHODS FOR FILTER CONSTRAINT ESTIMATION

BACKGROUND OF THE INVENTION

The present inventions are related to systems and methods for data processing, and more particularly to systems and methods for loop calibration.

Various data processing devices have been developed that include one or more processing elements that may be tuned. In some cases, the tuning of one processing element effects the tuning of another processing element. This can require an iterative approach to processing where a set of optimal tuning values for the processing elements are identified. Such an iterative approach can be quite time consuming, and therefore costly.

Hence, for at least the aforementioned reasons, there exists a need in the art for advanced systems and methods for calibration.

BRIEF SUMMARY OF THE INVENTION

The present inventions are related to systems and methods for data processing, and more particularly to systems and methods for loop calibration.

Various embodiments of the present invention provide methods for calibrating a data processing circuit. The methods include providing a digital filter, providing a detector circuit, and providing an analog filter. Operation of the digital filter is at least in part governed by filter taps that correspond to a filter tap constraint value. Operation of the detector circuit is at least in part governed by a target parameter. Operation of the analog filter is at least in part governed by an analog parameter that is one of a plurality of analog parameters. The methods further include selecting a target parameter, and calculating the filter tap constraint value based on the target parameter. Combinations of the target parameter, the calculated filter tap constraint value, and each of the plurality of analog parameters are applied to identify the analog parameter. In some instances of the aforementioned embodiments, the analog parameter may include one or both of a cutoff frequency for the analog filter and a gain of the analog filter. In various instances of the aforementioned embodiments, the methods further include selecting the filter taps that correspond to a filter tap constraint value.

In various instances of the aforementioned embodiments, the target parameter includes three target values, T0, T1, T2. In such instances, calculating the filter tap constraint value is done in accordance with the following equation:

Filter Tap Constraint Value=Slope*(Derived Value of Target Parameters)+Offset.

In this case, the derived value of target parameters is calculated in accordance with the following equation:

$$\text{Derived Value of Target Parameters} = \frac{T0 - T2}{T1},$$

where T0 is a target value corresponding to a current bit period, T1 is a target value corresponding to the bit period directly preceding the current bit period, and T2 is a target value corresponding to a bit period that is two bit periods prior to the current bit period.

In some such instances, the analog parameter is a first analog parameter and the filter tap constraint value is a first filter tap constraint value. The methods further include applying combinations of the target parameter, the first analog parameter, a second analog parameter, the first filter tap constraint value, and second filter tap constraint value to a representative device to determine an optimal combination of the target parameter, one of the first analog parameter and the second analog parameter, and one of the first filter tap constraint value and the second filter tap constraint value; and based at least in part on the optimal combination, establishing a value for the Slope and the Offset of the preceding equation.

In one or more instances of the aforementioned embodiments, the methods further include: selecting a representative device, and establishing the filter tap constraint value to target parameter ratio for the representative device. In some such instance, calculating the filter tap constraint value based on the target parameter is done in other than the representative device and uses the filter tap constraint value to target parameter ratio.'

In various instances of the aforementioned embodiments, the filter tap constraint value is a value corresponding to the phase of the digital filter. In some instances of the aforementioned embodiments, the filter tap constraint value defines a relationship between at least two of the filter taps. In one such case, the filter taps includes at least a first filter tap, a second filter tap, and a third filter tap. In the case, the second filter tap is a main tap, and the filter tap constraint value is calculated in accordance with the following equation:

filter tap constraint value=the third filter tap−the first filter tap.

Other embodiments of the present invention provide data processing circuits that include a digital filter, a detector circuit, and a filter tap selector circuit. Operation of the digital filter is at least in part governed by filter taps that correspond to a filter tap constraint value, and operation of the detector circuit is at least in part governed by a target parameter. The filter tap selector circuit is operable to select the filter taps for the digital filter based at least in part on the target parameter and a predefined relationship between the filter tap constraint value and the target parameter. In some instances of the aforementioned embodiments, the data processing circuit is implemented as part of a first device, and the relationship between the filter tap constraint value and the target parameter is established using a second device.

In one or more instances of the aforementioned embodiments, the data processing circuit further includes an analog filter, and a calibration control circuit. The analog filter is at least in part governed by an analog parameter, and the analog parameter is one of a plurality of analog parameters. The calibration control circuit is operable to apply combinations of the target parameter, the calculated filter tap constraint value, and each of a plurality of analog parameters to identify the analog parameter. In some such instances, the analog parameter may be one or both of a cutoff frequency for the analog filter and a gain of the analog filter.

In various instances of the aforementioned embodiments, the filter tap constraint value is a value corresponding to the phase of the digital filter. In some instances of the aforementioned embodiments, the filter tap constraint value defines a relationship between at least two of the filter taps. In one such case, the filter taps includes at least a first filter tap, a second filter tap, and a third filter tap. In the case, the second filter tap is a main tap, and the filter tap constraint value is calculated in accordance with the following equation:

filter tap constraint value=the third filter tap−the first filter tap.

Yet other embodiments of the present invention provide methods for calibrating a data processing circuit. The methods include providing a digital filter where operation of the digital filter is at least in part governed by filter taps that correspond to a filter tap constraint value; providing a detector circuit where operation of the detector circuit is at least in part governed by a target parameter; selecting a target parameter; calculating the filter tap constraint value based on the target parameter; and selecting the filter taps that correspond to the filter tap constraint value.

This summary provides only a general outline of some embodiments of the invention. Many other objects, features, advantages and other embodiments of the invention will become more fully apparent from the following detailed description, the appended claims and the accompanying drawings.

BRIEF DESCRIPTION OF THE DRAWINGS

A further understanding of the various embodiments of the present invention may be realized by reference to the figures which are described in remaining portions of the specification. In the figures, like reference numerals are used throughout several figures to refer to similar components. In some instances, a sub-label consisting of a lower case letter is associated with a reference numeral to denote one of multiple similar components. When reference is made to a reference numeral without specification to an existing sub-label, it is intended to refer to all such multiple similar components.

DETAILED DESCRIPTION OF THE INVENTION

The present inventions are related to systems and methods for data processing, and more particularly to systems and methods for loop calibration.

Figure 1:
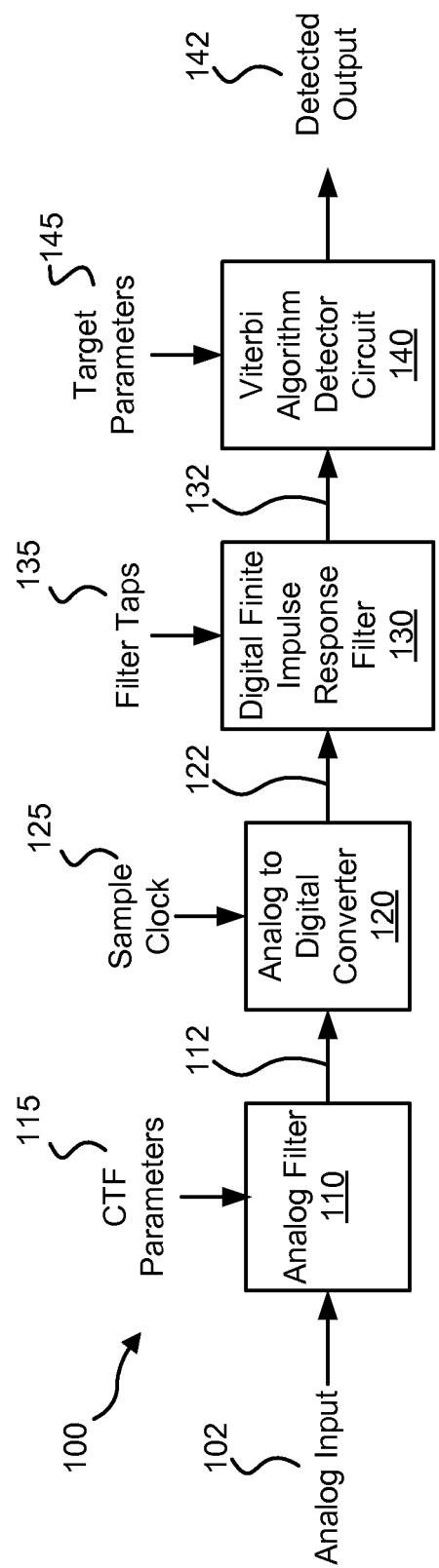
FIG. 1 depicts an existing processing circuit including various tunable parameters.

Turning to FIG. 1, an existing processing circuit 100 including various tunable parameters is depicted. Processing circuit 100 includes an analog filter circuit 110 that receives an analog input 102 and provides a filtered analog signal 112. The analog filtering performed by analog filter circuit 110 is governed by continuous time filter (CTF) parameters 115. Filtered analog signal 112 is provided to an analog to digital converter circuit 120 that converts the received input into a corresponding series of digital samples 122. Analog to digital converter circuit 120 performs sampling of filtered analog signal 112 synchronous to sample clock 125 to yield respective ones of digital samples 122.

Digital samples 122 are provided to a digital finite impulse response filter 130 that filters the received input and provides a corresponding digital filter output 132. Digital finite impulse response filter 130 performs filtering as governed by filter taps 135. Digital filter output 132 is provided to a Viterbi algorithm detector circuit 140 that performs a detection process on the received input and provides a detected output 142. The detection process is performed in accordance with target parameters 145.

Prior to the operation processing circuit 100, CTF parameters 115, a filter tap constraint from which filter taps 135 may be based, and target parameters 145 are calibrated. This calibration typically involves operating processing circuit using different combinations of CTF parameters 115, filter tap constraints, and target parameters 145 to determine which combination yields the most favorable operational characteristics of processing circuit 100. Once the appropriate operational parameters are selected, processing circuit is operated with the selected parameters. This process of calibration is time consuming resulting in extra costs during the manufacturing process of devices using processing circuit 100. Further, the time demand limits the ability to recalibrate the parameters of processing circuit 100 when a device including processing circuit 100 has been deployed.

Figure 2:
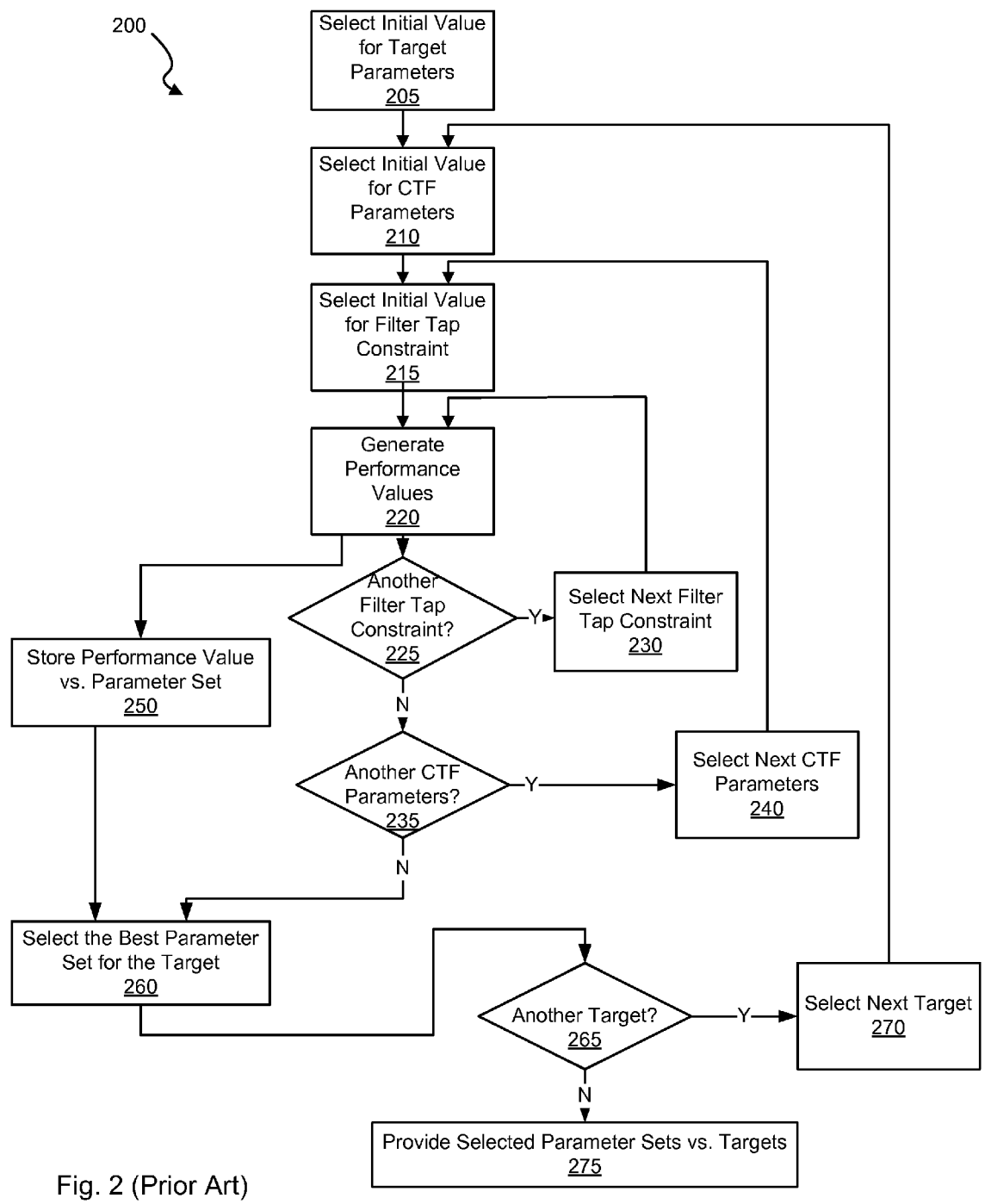
FIG. 2 depicts an existing method for calibrating the tunable parameters in the circuit of FIG. 1.

Turning to FIG. 2, a flow diagram 200 depicts an existing method for calibrating the tunable parameters of processing circuit 100. Following flow diagram 200, an initial value for target parameters 145 is selected (block 205), an initial value for CTF parameters 115 is selected (block 210), and an initial value for a filter constraint is selected (block 215). Processing circuit 100 is then operated using a known data input set provided via analog input 102 such that a data output set is derived and provided as detected output 142. Based on this operation, one or more performance values are generated (block 220).

These performance values are stored in a memory along with the selected parameter set (CTF parameters, filter tap constraint, target parameters) that yielded the result (block 250). It is determined whether another filter tap constraint remains to be tested (block 225). Where another set of filter tap constraint remains to be tested (block 225), the next value for the filter constraint is selected (block 230) and the processes of blocks 220, 225, 250 are performed using the previously selected value for CTF parameters 115 and the previously selected value for target parameters 145.

Alternatively, where all of the possible or allowable values of the filter tap constraints have been used (block 225), it is determined whether another value of CTF parameters 115 remain to be tested (block 235). Where another value of CTF parameters 115 remains to be tested (block 235), the next value of CTF parameters 115 is selected (block 240), and the processes of blocks 215, 220, 225 are performed using the previously selected target parameters 145 and an initial value for the filter tap constraint.

Alternatively, where all of the possible or allowable values of CTF parameters 115 have been used (block 235), the stored performance values are retrieved from the memory in which they were stored, and the values for CTF parameters 115 and filter tap constraint are selected that correspond to the best performance value (block 260). This is the set of parameters that are used whenever the particular target is selected. It is then determined whether another target is to be calibrated (block 265). Where another target is to be calibrated (block 265), the next value for target parameters 145 is selected (block 270) and the processes of blocks 210, 215, 220, 225 are performed using an initial value for the filter tap constraint and an initial value for CTF parameters 210. Where, on the other hand, no additional targets remain to be calibrated (block 265), the selected parameter sets are provided as an output of the calibration process (block 270). Again, this process of calibration is time consuming resulting in extra costs during the manufacturing process of devices using processing circuit 100. Further, the time demand limits the ability to recalibrate the parameters of processing circuit 100 when a device including processing circuit 100 has been deployed.

Various embodiments of the present invention provide a mechanism for eliminating search based approaches for determining appropriate filter taps to be used in relation to the digital filter. In particular, it has been determined that in a well optimized processing circuit including a filter tap constraint value, a value for CTF parameters, and a value for target parameters, that there is a linear relationship between the filter tap constraint value and the value of the target parameters. The sampling phases of an analog to digital conversion are similar for all targets where the processing circuit is well optimized. Using the linear relationship between the filter tap constraint value and the value of the target parameters, the filter tap constraint value may be directly calculated once the value of the target parameters is selected. Such an approach involves determining the linear relationship between the filter tap constraint value and the value of the target parameters. This relationship is consistent across a given design, and thus determining the relationship may be done once for a number of devices. As used herein, the phase "filter tap constraint value" is used in its broadest sense to mean any value that corresponds to a subset of possible filter taps. In some embodiments, the filter tap constraint value is a value corresponding to the phase of the filter. As a particular example, where the filter uses three or more taps and the main tap is tap(i), the filter tap constraint value may be the difference between the taps on either side of the main tap as shown in the following equation:

filter tap constraint value=tap($i$+1)-tap($i$-1).

Based on the disclosure provided herein, one of ordinary skill in the art will recognize other possible filter tap constraint values that may be utilized.

Figure 3A:
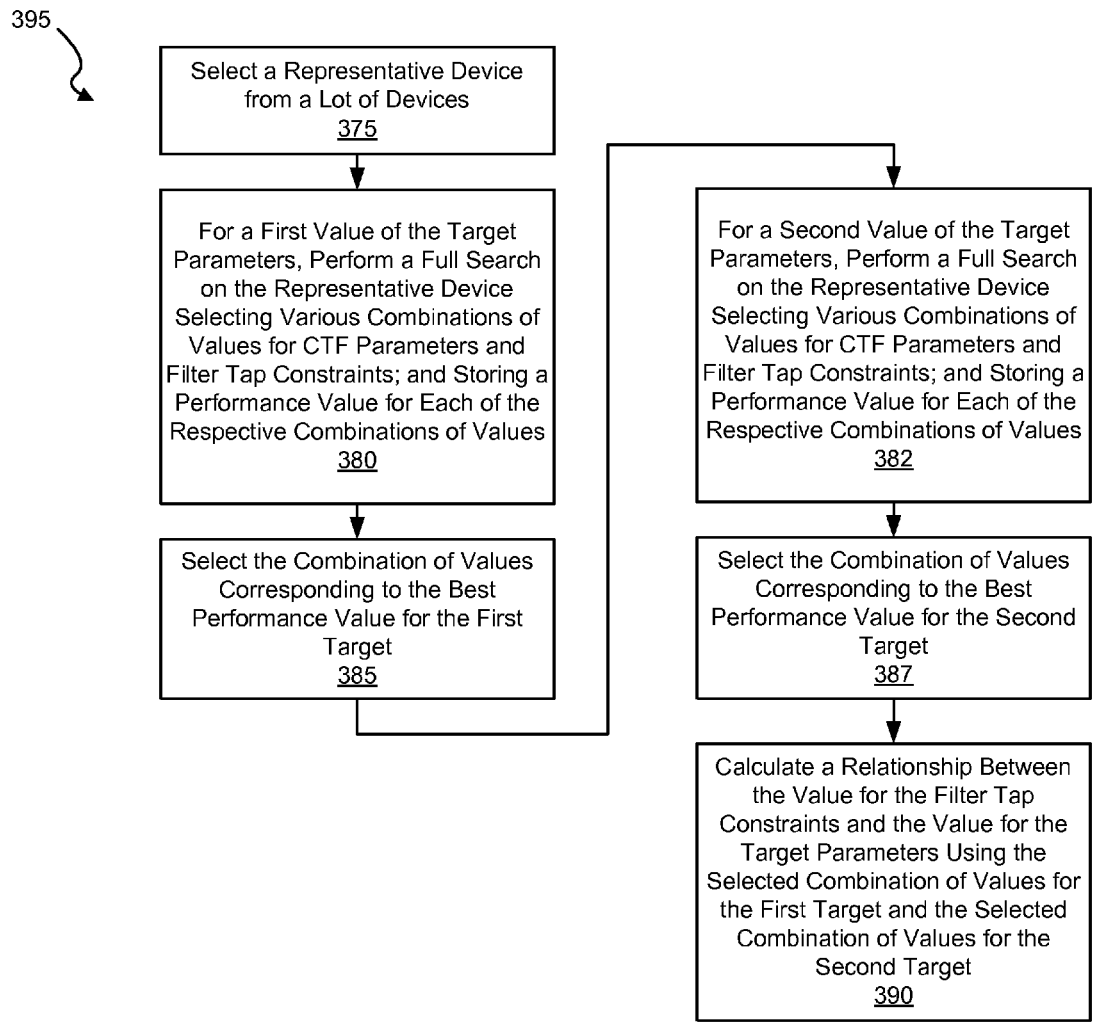
FIGS. 3a-3b depict enhanced methods for calibrating tunable parameters in a data processing circuit in accordance with some embodiments of the present invention.

The relationship between the filter tap constraint value and the value of the target parameters may then be programmed across the lot of the devices which are then each individually optimized through use of the relationship. In particular, once a target is selected for a particular device, the filter tap constraint value are directly calculated for the particular device. Using the directly calculated filter tap constraint value, a search process is performed to establish a value for the CTF parameters. Of note, this calibration process eliminates one degree of freedom in the search process which greatly reduces the time required to complete the calibration. As just some of many advantages achievable though use of embodiments of the present invention, Turning to FIG. 3a, a flow diagram 395 depicts a method in accordance with one or more embodiments of the present invention for calculating a relationship between a filter tap constraint value and a value for target parameters in a processing circuit. Following flow diagram 395, a representative device from a lot of devices is selected for calibration (block 375). As the relationship to be calculated in the calibration process depicted in flow diagram 395 works across devices of similar design, an extensive calibration may only be required for one representative device. Using the representative device, a full search across various combinations of values for CTF parameters and filter tap constraint value is performed for a first value of target parameters (block 380). The first value of target parameters may be selected as any of the values of target parameters supported by the device under calibration. As used herein, the phrase "value of the CTF parameters" is used in its broadest sense to mean a combination of one or more parameters applied to an analog filter circuit. As an example, the CTF parameters may include a cutoff frequency for an analog filter and a gain of the analog filter. In such a case, the value of the CTF parameters is the combination of the cutoff frequency input and the gain input for the analog filter. Based upon the disclosure provided herein, one of ordinary skill in the art will recognize a variety of analog filter parameters that may be included in CTF parameters in accordance with different embodiments of the present invention. A performance value for each of the respective combinations is stored as the search is performed. This process may be performed, for example, in a similar fashion to that discussed above in relation to blocks 210-250 of FIG. 2 above. Once performance values have been generated for a desired number of combinations of filter tap constraint values and CTF parameters (block 380), a combination of values of CTF parameters and a filter tap constraint value is selected that yielded the best performance value for the first value of the target parameters (block 385).

Again using the representative device, a full search across various combinations of values for CTF parameters and filter tap constraint values is performed for a second value of target parameters (block 382). The second value of target parameters, like the first value, may be selected as any of the values of target parameters supported by the device under calibration. A performance value for each of the respective combinations is stored as the search is performed. This process may be performed, for example, in a similar fashion to that discussed above in relation to blocks 210-250 of FIG. 2 above. Once performance values have been generated for a desired number of combinations of filter tap constraint values and CTF parameters (block 382), a combination of values of CTF parameters and a filter tap constraint value is selected that yielded the best performance value for the second value of the target parameters (block 387).

Using the two sets of value combinations determined through the search process for the representative device, a relationship between the filter tap constraint value and the value for the target parameters is calculated (block 390). In particular, it has been determined that the relationship between the filter tap constraint value and the value for the target parameters coincides approximately with the following linear equation:

Filter Tap Constraint Value=Slope*(Derived Value of Target Parameters)+Offset.

In this case, the derived value of target parameters is calculated in accordance with the following equation:

$$\text{Derived Value of Target Parameters} = \frac{T0 - T2}{T1},$$

where T0 is a target value corresponding to a current bit period, T1 is a target value corresponding to the bit period directly preceding the current bit period, and T2 is a target value corresponding to a bit period that is two bit periods prior to the current bit period. In this case, the combination of T0, T1 and T2 are considered "the value of the target parameters".

By using two combinations of values of the target parameters and the filter tap constraint value, the aforementioned equation can be used to calculate the Slope and Offset values. In one particular case, the Slope is calculated at '−144' and the Offset is calculated as '32'. The resolved equation including the calculated Slope and Offset values establishes a relationship between the filter tap constraint value and the value for the target parameters that may be used across all devices that share a similar design to that of the representative device.

Figure 3B:
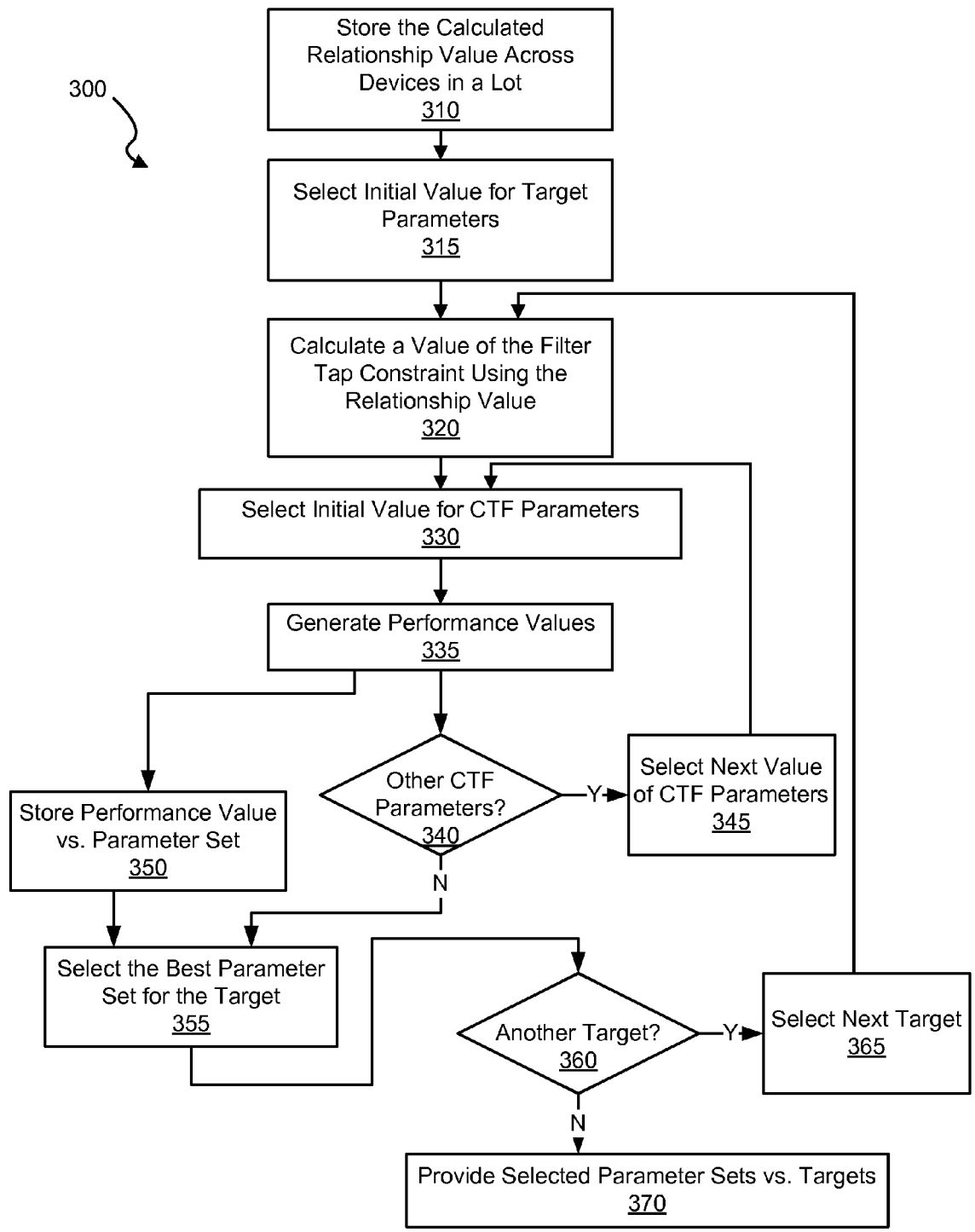

Turning to FIG. 3b, a flow diagram 300 depicts a method in accordance with various embodiments of the present invention for calibrating CTF parameters for a device relying on the relationship developed for a representative device. Following flow diagram 300, the relationship value representing the relationship between the filter tap constraint value and the value for the target parameters is stored to a register for a device of the same design or lot as the representative device from which it was derived (block 310). This may include, for example, writing the Slope and Offset values of the relationship to a register in the particular device that is to be calibrated.

An initial value for the target parameters for the device is then selected (block 315). Where the target parameters include three values (T0, T1, T2), selecting the initial value for the target parameters may include selecting values for T0, T1, T2. In some embodiments of the present invention, the device being calibrated is pre-programmed with one or more values of target parameters that are expected to be used during operation of the device under calibration. During calibration, these one or more values of target parameters are accessed, and the calibration establishes a value of CTF parameters and a filter tap constraint value corresponding to the respective value of the target parameters.

Using the selected value of the target parameters and the relationship value, a filter tap constraint value is directly calculated in accordance with the following equation:

Filter Tap Constraint Value=Slope*(Derived Value of Target Parameters)+Offset, (block 320) where the derived value of target parameters is calculated in accordance with the following equation:

$$\text{Derived Value of Target Parameters} = \frac{T0 - T2}{T1}.$$

An initial value for the CTF parameters is selected (block 330). Where the CTF parameters include a cutoff frequency and a gain for an analog filter circuit, selecting the initial value for the CTF parameters includes selecting an initial combination of cutoff frequency and gain for the analog filter circuit.

The circuit under calibration is then operated using a known data input set such that a data output set is derived. Based on this operation, one or more performance values are generated (block 335). These performance values are stored in a memory along with the selected parameter set (CTF parameters, filter tap constraint value, target parameters) that yielded the result (block 350). It is determined whether another value of CTF parameters remain to be tested (block 340). Where another value of CTF parameters remains to be tested (block 340), the next value of CTF parameters is selected (block 345) and the processes of blocks 330, 335, 340, 350 are performed using the previously calculated filter tap constraint value and the previously selected value for the target parameters.

Alternatively, where all of the possible or allowable values of CTF parameters have been used (block 340), the stored performance values are retrieved from the memory in which they were stored, and the value for the CTF parameters is selected that corresponds to the best performance value (block 355). The identified value for the CTF parameters, along with the calculated filter tap constraint value are used whenever the particular target is selected. It is then determined whether another target is to be calibrated (block 360). Where another target is to be calibrated (block 360), the next value for the target parameters is selected (block 365) and the processes of blocks 320, 330, 335, 340, 345, 350, 355 are performed starting with a newly calculated filter tap constraint value and an initial value for the CTF parameters. Where, on the other hand, no additional targets remain to be calibrated (block 360), the selected parameter sets are provided as an output of the calibration process (block 370).

Figure 4A:
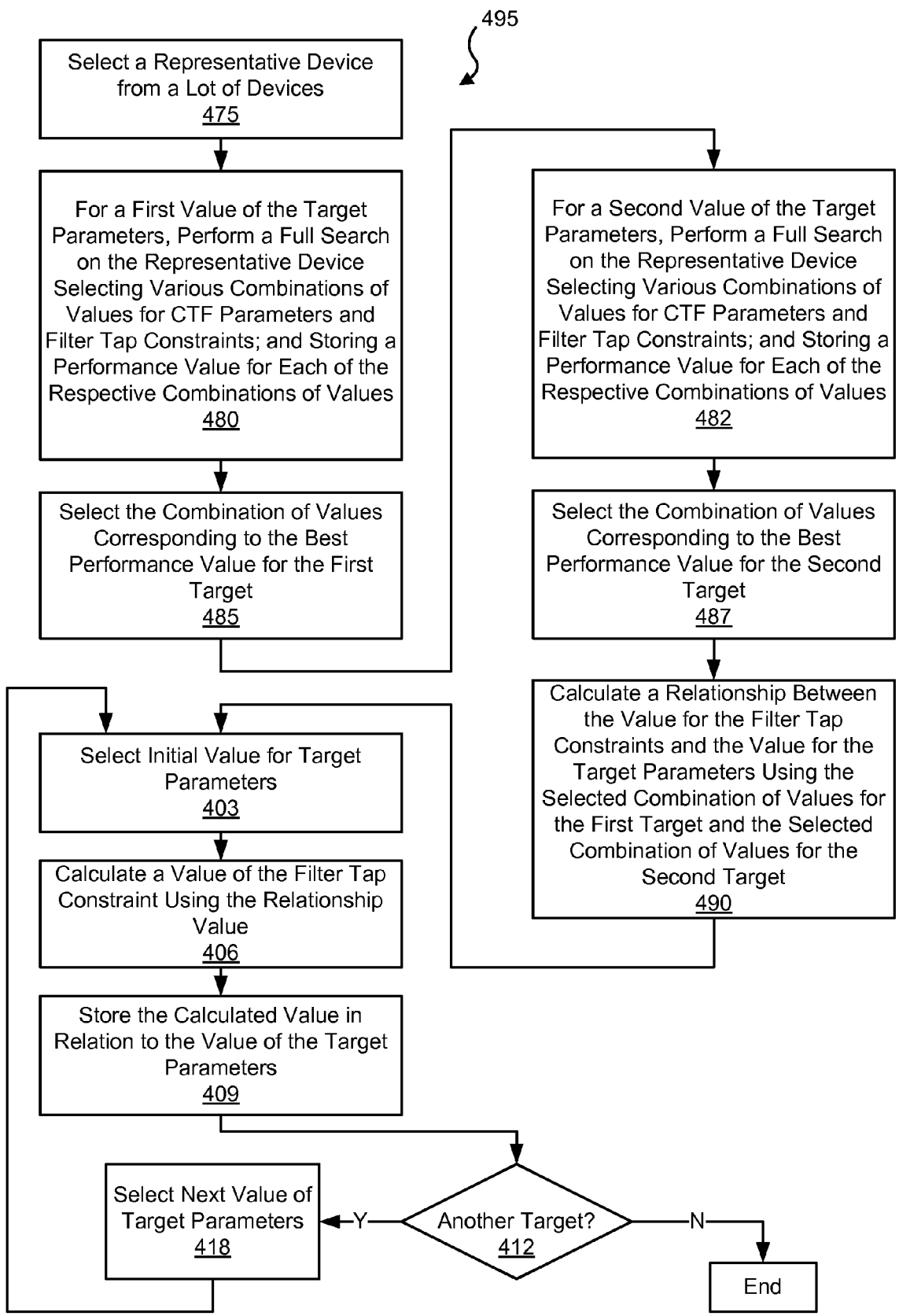
FIGS. 4a-4b depict other enhanced methods for calibrating tunable parameters in a data processing circuit in accordance with other embodiments of the present invention.

Turning to FIG. 4a, a flow diagram 495 depicts a method in accordance with one or more embodiments of the present invention for calibrating using a relationship between a filter tap constraint value and a value fore target parameters in a processing circuit. Following flow diagram 495, a representative device from a lot of devices is selected for calibration (block 475). As the relationship to be calculated in the calibration process depicted in flow diagram 495 works across devices of similar design, an extensive calibration may only be required for one representative device. Using the representative device, a full search across various combinations of values for CTF parameters and filter tap constraint values is performed for a first value of target parameters (block 480). The first value of target parameters may be selected as any of the values of target parameters supported by the device under calibration. A performance value for each of the respective combinations is stored as the search is performed. This process may be performed, for example, in a similar fashion to that discussed above in relation to blocks 210-250 of FIG. 2 above. Once performance values have been generated for a desired number of combinations of filter tap constraint values and CTF parameters (block 480), a combination of values of CTF parameters and a filter tap constraint value is selected that yielded the best performance value for the first value of the target parameters (block 485).

Again using the representative device, a full search across various combinations of values for CTF parameters and filter tap constraint values is performed for a second value of target parameters (block 482). The second value of target parameters, like the first value, may be selected as any of the values of target parameters supported by the device under calibration. A performance value for each of the respective combinations is stored as the search is performed. This process may be performed, for example, in a similar fashion to that discussed above in relation to blocks 210-250 of FIG. 2 above. Once performance values have been generated for a desired number of combinations of filter tap constraint values and CTF parameters (block 482), a combination of values of CTF parameters and a filter tap constraint value is selected that yielded the best performance value for the second value of the target parameters (block 487).

Using the two sets of value combinations determined through the search process for the representative device, a relationship between the value for the filter taps and the value for the target parameters is calculated (block 490). In particular, it has been determined that the relationship between the filter tap constraint value and the value for the target parameters coincides approximately with the following linear equation:

Filter Tap Constraint Value=Slope*(Derived Value of Target Parameters)+Offset.

In this case, the derived value of target parameters is calculated in accordance with the following equation:

$$\text{Derived Value of Target Parameters} = \frac{T0 - T2}{T1},$$

where T0 is a target value corresponding to a current bit period, T1 is a target value corresponding to the bit period directly preceding the current bit period, and T2 is a target value corresponding to a bit period that is two bit periods prior to the current bit period. In this case, the combination of T0, T1 and T2 are considered "the value of the target parameters".

By using two combinations of values of the target parameters and the filter tap constraint value, the aforementioned equation can be used to calculate the Slope and Offset values. In one particular case, the Slope is calculated at '−144' and the Offset is calculated as '32'. The resolved equation including the calculated Slope and Offset values establishes a relationship between the filter tap constraint value and the value for the target parameters that may be used across all devices that share a similar design to that of the representative device.

An initial value of the target parameters is selected (block 403). Where the target parameters include three values (T0, T1, T2), selecting the initial value for the target parameters may include selecting values for T0, T1, T2. In some embodiments of the present invention, a number of values of the target parameters are tested to provide corresponding values for filter taps. Using the selected value of the target parameters and the relationship value, a filter tap constraint value corresponding to the selected value of the target parameters is directly calculated in accordance with the following equation:

Filter Tap Constraint Value=Slope*(Derived Value of Target Parameters)+Offset, (block 406) where the derived value of target parameters is calculated in accordance with the following equation:

$$\text{Derived Value of Target Parameters} = \frac{T0 - T2}{T1}.$$

The calculated value of the filter taps is then stored in relation to the corresponding value of the target parameters (block 409).

It is determined whether another value of the target parameters remains to be processed (block 412). Where another value remains to be processed (block 412), the next value of the target parameters is selected (block 418). Using this selected value of the target parameters, the processes of blocks 403, 406, 409, 412 are repeated to obtain the corresponding filter tap constraint value.

Figure 4B:
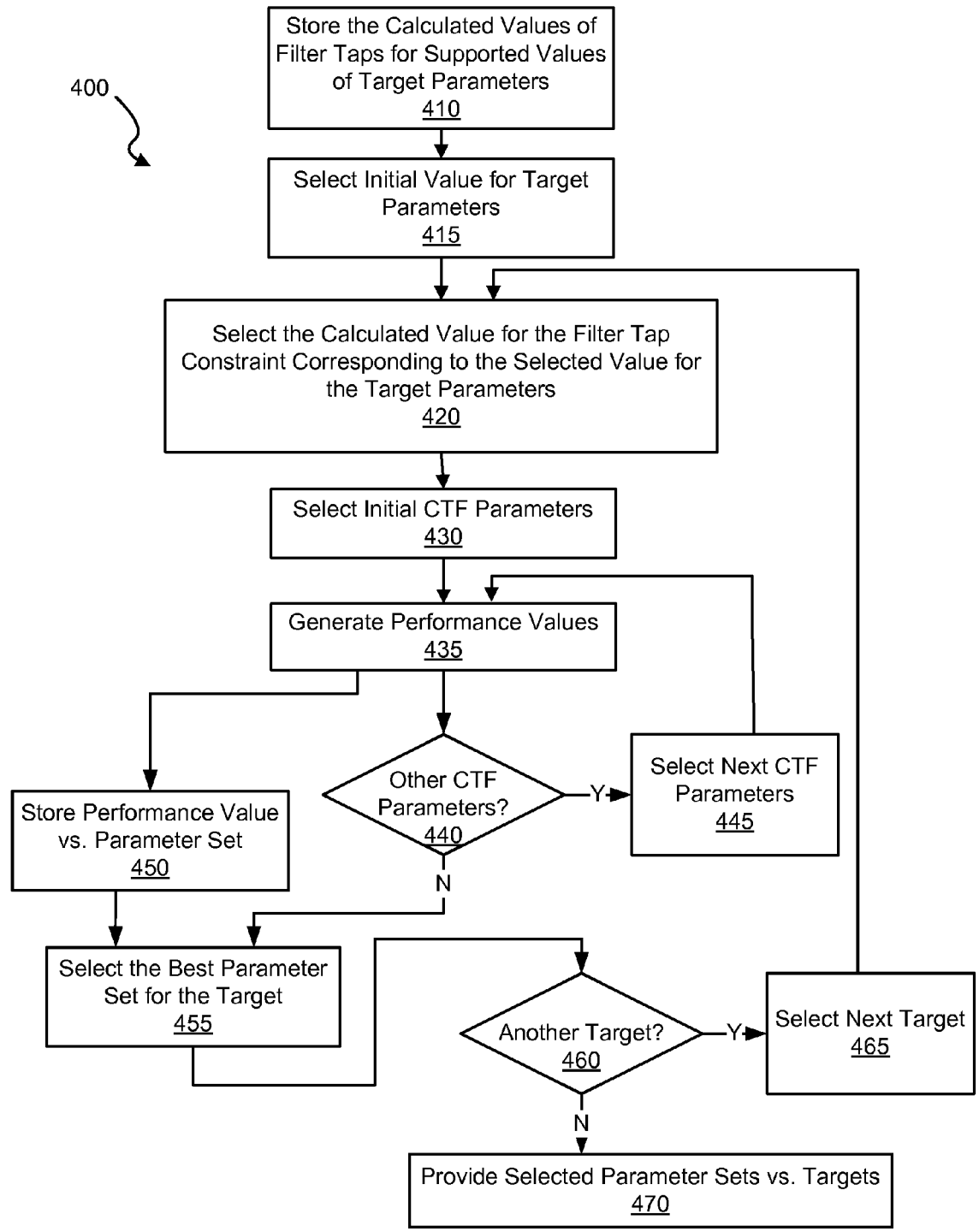

Turning to FIG. 4b, a flow diagram 400 depicts a method in accordance with various embodiments of the present invention for calibrating the value of CTF parameters for a device relying on direct calculated filter tap constraint value developed for a representative device. Following flow diagram 400, the direct calculated filter tap constraint value corresponding to values of target parameters expected to be used in relation to operating the particular device are stored to the particular device (block 410). An initial value for the target parameters for the device is then selected (block 415). Where the target parameters include three values (T0, T1, T2), selecting the initial value for the target parameters may include selecting values for T0, T1, T2. In some embodiments of the present invention, the device being calibrated is pre-programmed with one or more values of target parameters that are expected to be used during operation of the device under calibration, along with the corresponding filter tap constraint values. During calibration, these one or more values of target parameters and corresponding filter tap constraint values are accessed, and the calibration establishes a value of CTF parameters.

A previously calculated filter tap constraint value corresponding to the selected value for the target parameters is selected (block 420), and an initial value of the CTF parameters is selected (block 430). The circuit under calibration is then operated using a known data input set such that a data output set is derived. Based on this operation, one or more performance values are generated (block 435). These performance values are stored in a memory along with the selected parameter set (CTF parameters, filter tap constraint values, target parameters) that yielded the result (block 450). It is determined whether another value of CTF parameters remains to be tested (block 440). Where another value of CTF parameters remains to be tested (block 440), the next value of CTF parameters is selected (block 445) and the processes of blocks 435, 440, 445, 450 are performed using the previously calculated filter tap constraint value and the previously selected value for the target parameters.

Alternatively, where all of the possible or allowable values of CTF parameters have been used (block 440), the stored performance values are retrieved from the memory in which they were stored, and the value for the CTF parameters is selected that corresponds to the best performance value (block 455). The identified value for the CTF parameters, along with the calculated filter tap constraint value are used whenever the particular target is selected. It is then determined whether another target is to be calibrated (block 460). Where another target is to be calibrated (block 460), the next value for the target parameters is selected (block 465) and the processes of blocks 420, 430, 435, 440, 445, 450, 455 are performed starting with a newly calculated value for the filter taps and an initial value for the CTF parameters. Where, on the other hand, no additional targets remain to be calibrated (block 460), the selected parameter sets are provided as an output of the calibration process (block 470).

Figure 5:
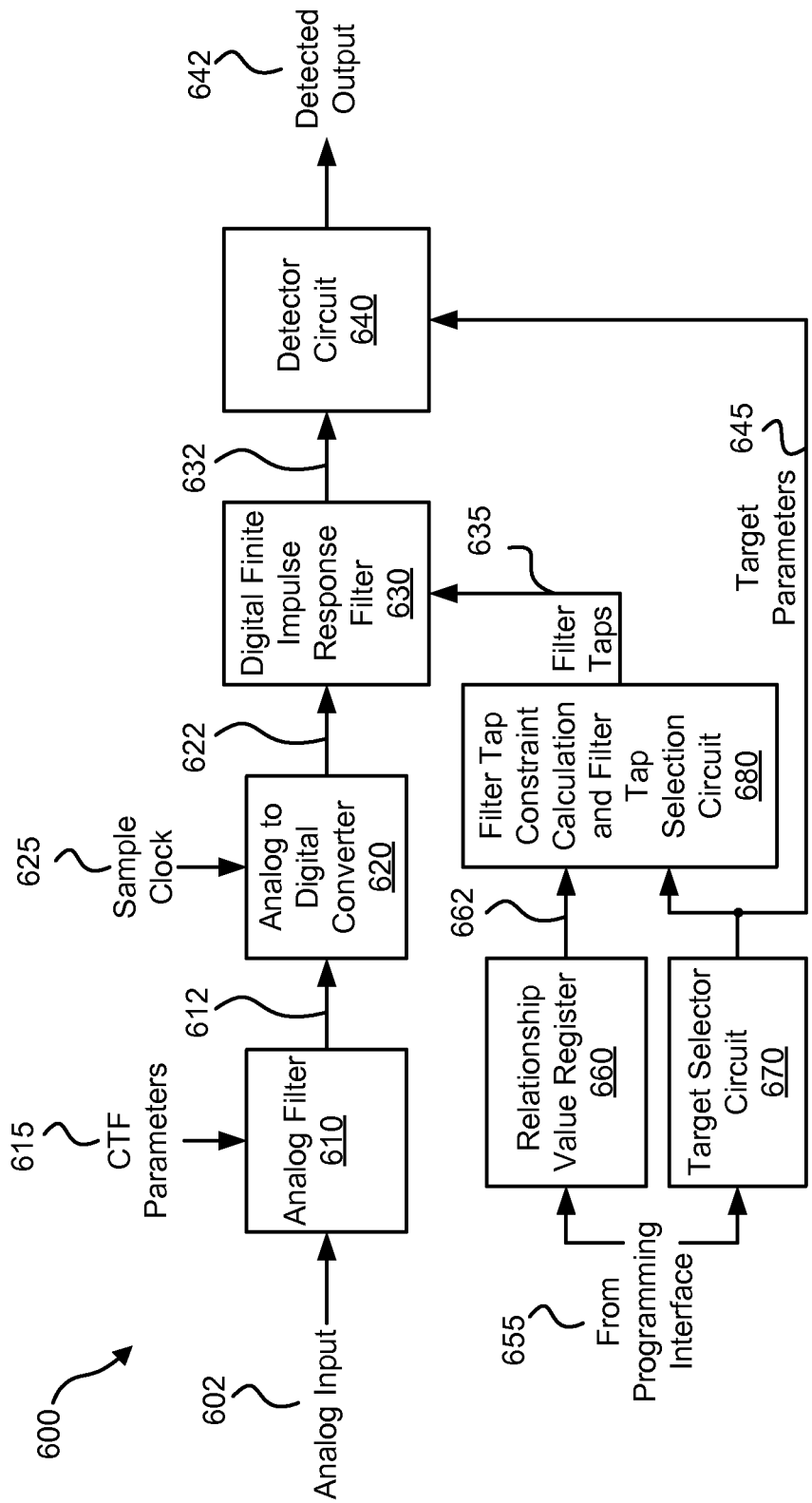
FIG. 5 shows a data processing circuit in accordance with one or more embodiments of the present invention using a relationship value register to support enhanced methods for calibration.

Turning to FIG. 5, a data processing circuit 600 is shown in accordance with the present invention that includes a relationship value register 660 to support enhanced methods for calibration. Data processing circuit 600 includes various circuitry that is controllable through use of one or more tunable parameters. Data processing circuit 600 includes an analog filter circuit 610 that receives an analog input 602 and provides a filtered analog signal 612. The analog filtering performed by analog filter circuit 610 is governed by continuous time filter (CTF) parameters 615. In one particular embodiment of the present invention, CTF parameters include a cutoff frequency for analog filter circuit 610, and a gain for analog filter circuit 610. Filtered analog signal 612 is provided to an analog to digital converter circuit 620 that converts the received input into a corresponding series of digital samples 622. Analog to digital converter circuit 620 performs sampling of filtered analog signal 612 synchronous to sample clock 625 to yield respective ones of digital samples 622.

Digital samples 622 are provided to a digital finite impulse response filter 630 that filters the received input and provides a corresponding digital filter output 632. Digital finite impulse response filter 630 performs filtering as governed by filter taps 635. Digital filter output 632 is provided to a detector circuit 640 that performs a detection process on the received input and provides a detected output 642. Detector circuit 640 may be any target based detector circuit known in the art including, but not limited to, a Viterbi algorithm detector circuit. The detection process is performed in accordance with target parameters 645.

In addition, data processing circuit 600 includes relationship value register 660 that is loaded from a programming interface 655 with a previously determined relationship between the filter tap constraint values and the value of the target parameters. In some cases, this includes the Slope and Offset values that may be used in relation to the following equation:

Filter Tap Constraint Value=Slope*(Derived Value of Target Parameters)+Offset, where the derived value of target parameters is calculated in accordance with the following equation:

$$\text{Derived Value of Target Parameters} = \frac{T0 - T2}{T1}.$$

In addition, a target selector circuit 670 is included that includes a number of values of target parameters that may be selected between during operation of data processing circuit 600.

In operation, a value of target parameters 645 is selected. This value of target parameters is provided to detector circuit 640 to govern the operation thereof. In addition, the value of target parameters 645 is provided to a filter tap calculation circuit 680. Filter tap constraint calculation and filter tap selection circuit 680 calculates a filter tap constraint value using relationship information 662 stored in relationship value register 660. In some cases, relationship information 662 includes Slope and Offset terms that may be used in the following equation implemented by filter tap calculation circuit 680:

Filter Tap Constraint Value=Slope*(Derived Value of Target Parameters)+Offset, where the derived value of target parameters is calculated in accordance with the following equation:

$$\text{Derived Value of Target Parameters} = \frac{T0 - T2}{T1}.$$

The calculated filter tap constraint value is used to select a corresponding set of filter taps 635 that are provided to govern operation of digital finite impulse response filter 630. A search is then performed using the filter tap constraint value and the value of target parameters 645 to discover the optimal value for CTF parameters 615 for use in relation to the other two parameter sets.

Figure 6:
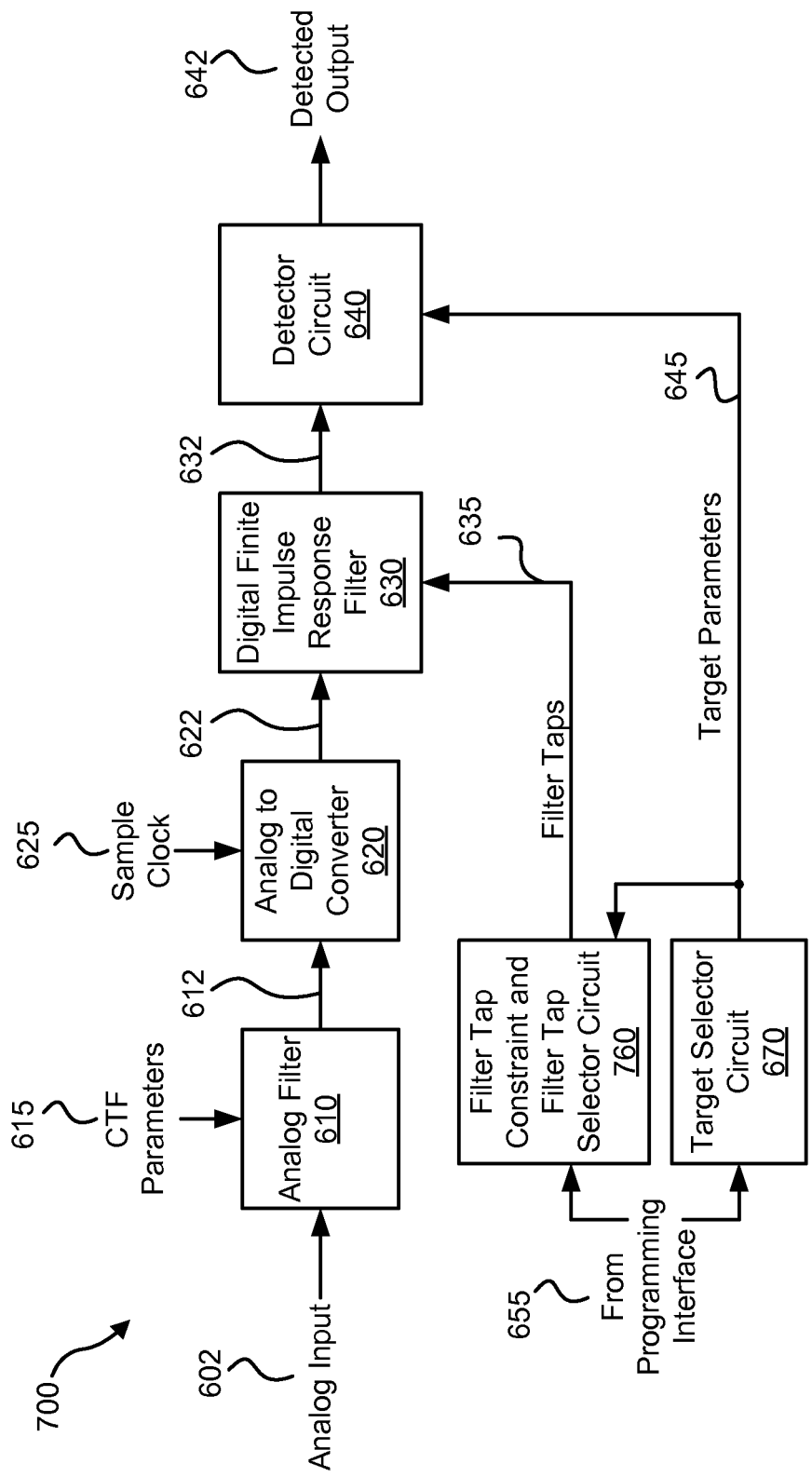
FIG. 6 shows a data processing circuit in accordance with some embodiments of the present invention that includes an enhanced calibration circuit.

Turning to FIG. 6, a data processing circuit 700 is shown in accordance with the present invention that includes a filter tap selector circuit 760 to support enhanced methods for calibration. Data processing circuit 700 includes various circuitry that is controllable through use of one or more tunable parameters. Data processing circuit 700 includes analog filter circuit 610 that receives analog input 602 and provides filtered analog signal 612. The analog filtering performed by analog filter circuit 610 is governed by continuous time filter (CTF) parameters 615. Filtered analog signal 612 is provided to analog to digital converter circuit 620 that converts the received input into a corresponding series of digital samples 622. Analog to digital converter circuit 620 performs sampling of filtered analog signal 612 synchronous to sample clock 625 to yield respective ones of digital samples 622.

Digital samples 622 are provided to digital finite impulse response filter 630 that filters the received input and provides a corresponding digital filter output 632. Digital finite impulse response filter 630 performs filtering as governed by filter taps 635. Digital filter output 632 is provided to detector circuit 640 that performs a detection process on the received input and provides detected output 642. The detection process is performed in accordance with target parameters 645.

In addition, data processing circuit 700 includes filter tap constraint and filter tap selector circuit 760 that is loaded from programming interface 655 with a previously calculated filter tap constraint values that each correspond to respective values of target parameters. In addition, a target selector circuit 670 is included that includes a number of values of target parameters that may be selected between during operation of data processing circuit 700.

In operation, a value of target parameters 645 is selected. This value of target parameters is provided to detector circuit 640 to govern the operation thereof. In addition, the value of target parameters 645 is provided to a filter tap constraint and filter tap selector circuit 760. Filter tap constraint and filter tap selector circuit 760 selects a previously calculated filter tap constraint value that corresponds to the selected value of the target parameters 645, and a set of filter taps 635 corresponding to the filter tap constraint value. The selected filter taps 635 is provided to govern operation of digital finite impulse response filter 630. A search is then performed using the filter tap constraint values and the value of target parameters 645 to discover the optimal value for CTF parameters 615 for use in relation to the other two parameter sets.

Figure 7:
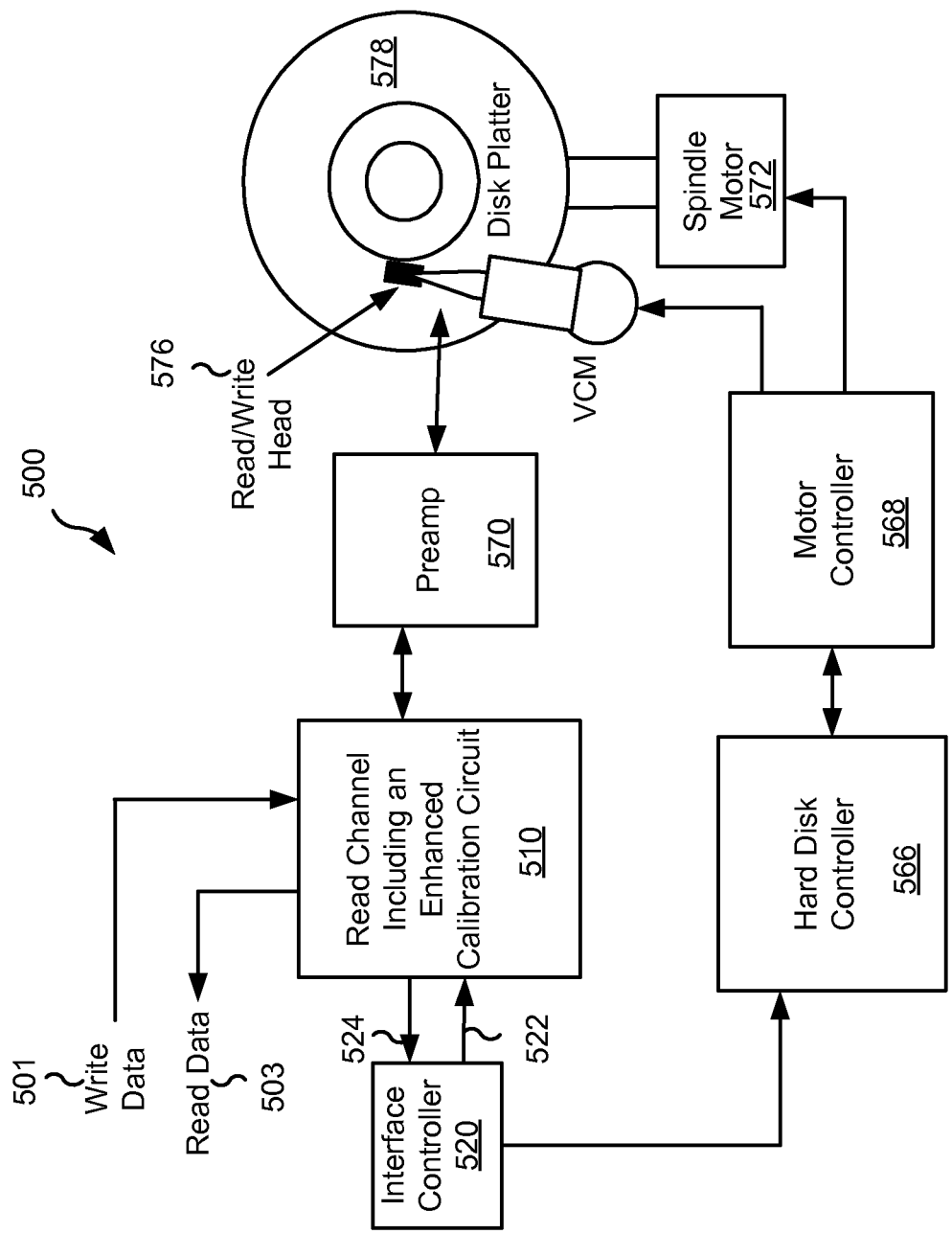
FIG. 7 shows a storage system including an enhanced calibration circuit in accordance with some embodiments of the present invention.

FIG. 7 shows a storage system 500 including a read channel circuit 510 with an enhanced calibration circuit in accordance with some embodiments of the present invention. Storage system 500 may be, for example, a hard disk drive. Storage system 500 also includes a preamplifier 570, an interface controller 520, a hard disk controller 566, a motor controller 568, a spindle motor 572, a disk platter 578, and a read/write head assembly 576. Interface controller 520 controls addressing and timing of data to/from disk platter 578. The data on disk platter 578 consists of groups of magnetic signals that may be detected by read/write head assembly 576 when the assembly is properly positioned over disk platter 578. In one embodiment, disk platter 578 includes magnetic signals recorded in accordance with either a longitudinal or a perpendicular recording scheme.

In a typical read operation, read/write head assembly 576 is accurately positioned by motor controller 568 over a desired data track on disk platter 578. Motor controller 568 both positions read/write head assembly 576 in relation to disk platter 578 and drives spindle motor 572 by moving read/write head assembly to the proper data track on disk platter 578 under the direction of hard disk controller 566. Spindle motor 572 spins disk platter 578 at a determined spin rate (RPMs). Once read/write head assembly 578 is positioned adjacent the proper data track, magnetic signals representing data on disk platter 578 are sensed by read/write head assembly 576 as disk platter 578 is rotated by spindle motor 572. The sensed magnetic signals are provided as a continuous, minute analog signal representative of the magnetic data on disk platter 578. This minute analog signal is transferred from read/write head assembly 576 to read channel circuit 510 via preamplifier 570. Preamplifier 570 is operable to amplify the minute analog signals accessed from disk platter 578. In turn, read channel circuit 510 decodes and digitizes the received analog signal to recreate the information originally written to disk platter 578. This data is provided as read data 503 to a receiving circuit. As part of decoding the received information, read channel circuit 510 processes the received signal using a an enhanced calibration circuit. Such an enhanced calibration circuit may be implemented consistent with that described above in relation to FIG. 5 or FIG. 6 above. In some cases, the enhanced calibration may be done consistent with the flow diagram discussed above in relation to FIG. 3b or FIG. 4b above. A write operation is substantially the opposite of the preceding read operation with write data 501 being provided to read channel circuit 510. This data is then encoded and written to disk platter 578.

It should be noted that storage system 500 may be integrated into a larger storage system such as, for example, a RAID (redundant array of inexpensive disks or redundant array of independent disks) based storage system. It should also be noted that various functions or blocks of storage system 500 may be implemented in either software or firmware, while other functions or blocks are implemented in hardware.

It should be noted that the various blocks discussed in the above application may be implemented in integrated circuits along with other functionality. Such integrated circuits may include all of the functions of a given block, system or circuit, or only a subset of the block, system or circuit. Further, elements of the blocks, systems or circuits may be implemented across multiple integrated circuits. Such integrated circuits may be any type of integrated circuit known in the art including, but are not limited to, a monolithic integrated circuit, a flip chip integrated circuit, a multichip module integrated circuit, and/or a mixed signal integrated circuit. It should also be noted that various functions of the blocks, systems or circuits discussed herein may be implemented in either software or firmware. In some such cases, the entire system, block or circuit may be implemented using its software or firmware equivalent. In other cases, the one part of a given system, block or circuit may be implemented in software or firmware, while other parts are implemented in hardware.

In conclusion, the invention provides novel systems, devices, methods and arrangements for data processing. While detailed descriptions of one or more embodiments of the invention have been given above, various alternatives, modifications, and equivalents will be apparent to those skilled in the art without varying from the spirit of the invention. Therefore, the above description should not be taken as limiting the scope of the invention, which is defined by the appended claims.

What is claimed is:

1. A method for calibrating a data processing circuit, the method comprising:
providing a digital filter, wherein operation of the digital filter is at least in part governed by filter taps that correspond to a filter tap constraint value;
providing a detector circuit, wherein operation of the detector circuit is at least in part governed by a target parameter;
providing an analog filter, wherein operation of the analog filter is at least in part governed by an analog parameter, and wherein the analog parameter is one of a plurality of analog parameters;
selecting the target parameter;
calculating the filter tap constraint value based on the target parameter;
applying combinations of the target parameter, the calculated filter tap constraint value, and each of the plurality of analog parameters to identify the analog parameter;
selecting a representative device; and
establishing a filter tap constraint value to target parameter ratio for the representative device.

2. The method of claim 1, wherein the analog parameter is selected from a group consisting of: a cutoff frequency for the analog filter, and a gain of the analog filter.

3. The method of claim 1, wherein the target parameter includes three target values, T0, T1, T2; and wherein calculating the filter tap constraint value is done in accordance with the following equation:

Filter Tap Constraint Value=Slope*(Derived Value of Target Parameters)+Offset, wherein the derived value of target parameters is calculated in accordance with the following equation:

$$\text{Derived Value of Target Parameters} = \frac{T0 - T2}{T1};$$

wherein T0 is a target value corresponding to a current bit period, wherein T1 is a target value corresponding to the bit period directly preceding the current bit period, and wherein T2 is a target value corresponding to a bit period that is two bit periods prior to the current bit period.

4. The method of claim 3, wherein the analog parameter is a first analog parameter, wherein the filter tap constraint value is a first filter tap constraint value, and wherein the method further comprises:
applying combinations of the target parameter, the first analog parameter, a second analog parameter, the first filter tap constraint value, and second filter tap constraint value to a representative device to determine an optimal combination of the target parameter, one of the first analog parameter and the second analog parameter, and one of the first filter tap constraint value and the second filter tap constraint value; and
based at least in part on the optimal combination, establishing a value for the Slope and the Offset.

5. The method of claim 1, wherein calculating the filter tap constraint value based on the target parameter is done in a device other than the representative device and uses the filter tap constraint value to target parameter ratio.

6. The method of claim 1, wherein the method further comprises:
selecting the filter taps that correspond to the calculated filter tap constraint value.

7. The method of claim 1, wherein the filter tap constraint value is a value corresponding to the phase of the digital filter.

8. The method of claim 1, wherein the filter tap constraint value defines a relationship between at least two of the filter taps.

9. The method of claim 8, wherein the filter taps include at least a first filter tap, a second filter tap, and a third filter tap; wherein the second filter tap is a main tap; and wherein the filter tap constraint value is calculated in accordance with the following equation:

filter tap constraint value=the third filter tap−the first filter tap.

10. A data processing circuit, wherein the data processing circuit comprises:
a digital filter, wherein operation of the digital filter is at least in part governed by filter taps that correspond to a filter tap constraint value; and
a detector circuit, wherein operation of the detector circuit is at least in part governed by a target parameter;
a filter tap selector circuit, wherein the filter tap selector circuit is operable to select the filter taps for the digital filter based at least in part on both the target parameter and a predefined relationship between the filter tap constraint value and the target parameter.

11. The data processing circuit of claim 10, wherein the data processing circuit is implemented as part of a first device, and wherein the relationship between the filter tap constraint value and the target parameter is established using a second device.

12. The data processing circuit of claim 10, wherein the data processing circuit further comprises:
   an analog filter, wherein operation of the analog filter is at least in part governed by an analog parameter, and wherein the analog parameter is one of a plurality of analog parameters; and
   a calibration control circuit, wherein the calibration control circuit is operable to apply combinations of the target parameter, the filter tap constraint value, and each of a plurality of analog parameters to identify the analog parameter.

13. The data processing circuit of claim 12, wherein the analog parameter is selected from a group consisting of: a cutoff frequency for the analog filter, and a gain of the analog filter.

14. The data processing circuit of claim 10, wherein the target parameter includes three target values, T0, T1, T2; and wherein the following equation represents the predefined relationship between the filter tap constraint value and the target parameter:

$$\text{Filter Tap Constraint Value} = \text{Slope} * (\text{Derived Value of Target Parameters}) + \text{Offset},$$

wherein the derived value of target parameters is calculated in accordance with the following equation:

$$\text{Derived Value of Target Parameters} = \frac{T0 - T2}{T1};$$

wherein T0 is a target value corresponding to a current bit period, wherein T1 is a target value corresponding to the bit period directly preceding the current bit period, and wherein T2 is a target value corresponding to a bit period that is two bit periods prior to the current bit period.

15. The data processing circuit of claim 10, wherein the filter tap constraint value is a value corresponding to the phase of the digital filter.

16. The data processing circuit of claim 10, wherein the filter tap constraint value defines a relationship between at least two of the filter taps.

17. The data processing circuit of claim 16, wherein the filter taps include at least a first filter tap, a second filter tap, and a third filter tap; wherein the second filter tap is a main tap; and wherein the filter tap constraint value is calculated in accordance with the following equation:

filter tap constraint value=the third filter tap−the first filter tap.

18. The data processing circuit of claim 10, wherein the data processing circuit is implemented as part of an integrated circuit.

19. A method for calibrating a data processing circuit, the method comprising:
   providing a digital filter, wherein operation of the digital filter is at least in part governed by at least a first filter tap, a second filter tap, and a third filter tap that correspond to a filter tap constraint value;
   providing a detector circuit, wherein operation of the detector circuit is at least in part governed by a target parameter;
   selecting a target parameter;
   calculating the filter tap constraint value based on the target parameter;
   selecting the filter taps that correspond to the filter tap constraint value; and
   wherein the second filter tap is a main tap; and wherein the filter tap constraint value is calculated in accordance with the following equation:

filter tap constraint value=the third filter tap−the first filter tap.

\* \* \* \* \*